US012660592B2

(12) United States Patent
Lee et al.

(10) Patent No.: US 12,660,592 B2
(45) Date of Patent: Jun. 16, 2026

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Chia Chen Lee, Taipei (TW); Chia-Tien Wu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 667 days.

(21) Appl. No.: 18/099,229

(22) Filed: Jan. 19, 2023

(65) Prior Publication Data

US 2024/0105591 A1     Mar. 28, 2024

Related U.S. Application Data

(60) Provisional application No. 63/409,790, filed on Sep. 25, 2022.

(51) Int. Cl.
*H10W 20/42*     (2026.01)
*H10W 20/00*     (2026.01)
*H10W 20/41*     (2026.01)

(52) U.S. Cl.
CPC ......... *H10W 20/42* (2026.01); *H10W 20/033* (2026.01); *H10W 20/056* (2026.01); *H10W 20/082* (2026.01); *H10W 20/435* (2026.01)

(58) Field of Classification Search
CPC ........... H01L 23/5226; H01L 21/76804; H01L 21/76843; H01L 21/76877; H01L 23/5283; H01L 21/76834; H01L 21/76883; H01L 23/53295; H01L 21/76885
See application file for complete search history.

(56) References Cited

U.S. PATENT DOCUMENTS

| | | | | |
|---|---|---|---|---|
| 9,911,651 B1* | 3/2018 | Briggs | .............. | H01L 21/76811 |
| 10,109,526 B1* | 10/2018 | Zhang | .............. | H01L 21/76897 |
| 10,347,528 B1* | 7/2019 | Singh | ................ | H01L 21/76816 |
| 2012/0100712 A1* | 4/2012 | Filippi | .............. | H01L 21/76802 |
| | | | | 438/643 |
| 2014/0284813 A1* | 9/2014 | Greco | .............. | H01L 21/31144 |
| | | | | 438/666 |
| 2015/0357282 A1* | 12/2015 | Lau | ........................ | H10D 84/83 |
| | | | | 257/774 |
| 2020/0388567 A1* | 12/2020 | Mignot | ............. | H01L 21/76877 |
| 2021/0384121 A1* | 12/2021 | Guo | ..................... | G06F 30/392 |

* cited by examiner

*Primary Examiner* — Karen Kusumakar

(74) *Attorney, Agent, or Firm* — NZ Carr Law Office

(57) ABSTRACT

An interconnect structure and methods of forming the same are described. In some embodiments, the structure includes a first dielectric layer disposed over a substrate, a second dielectric layer disposed over the first dielectric layer, and a first conductive feature disposed in the second dielectric layer. The first conductive feature has a first top critical dimension and a first height. The structure further includes a second conductive feature disposed in the first and second dielectric layers. The second conductive feature has a second top critical dimension substantially greater than the first top critical dimension and a second height substantially greater than the first height.

20 Claims, 15 Drawing Sheets

INTERCONNECT STRUCTURE AND METHODS OF FORMING THE SAME

CROSS-REFERENCE TO RELATED APPLICATIONS

This application claims priority to U.S. Provisional Application Ser. No. 63/409,790 filed Sep. 25, 2022, which is incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with improved sheet resistance are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
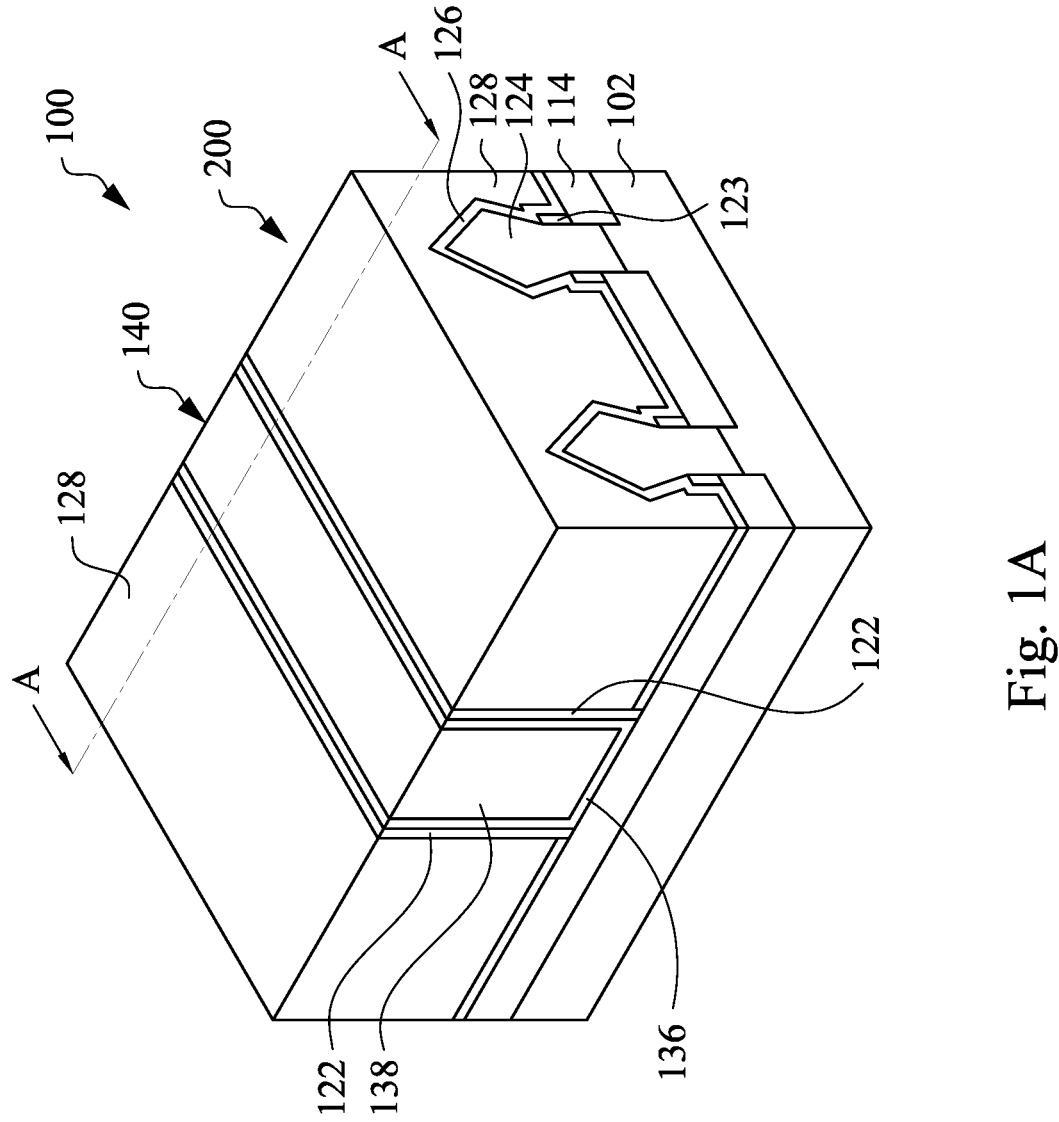
FIG. 1A is a perspective view of one of various stages of manufacturing a semiconductor device structure, in accordance with some embodiments.
Figure 1A:
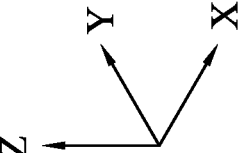

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
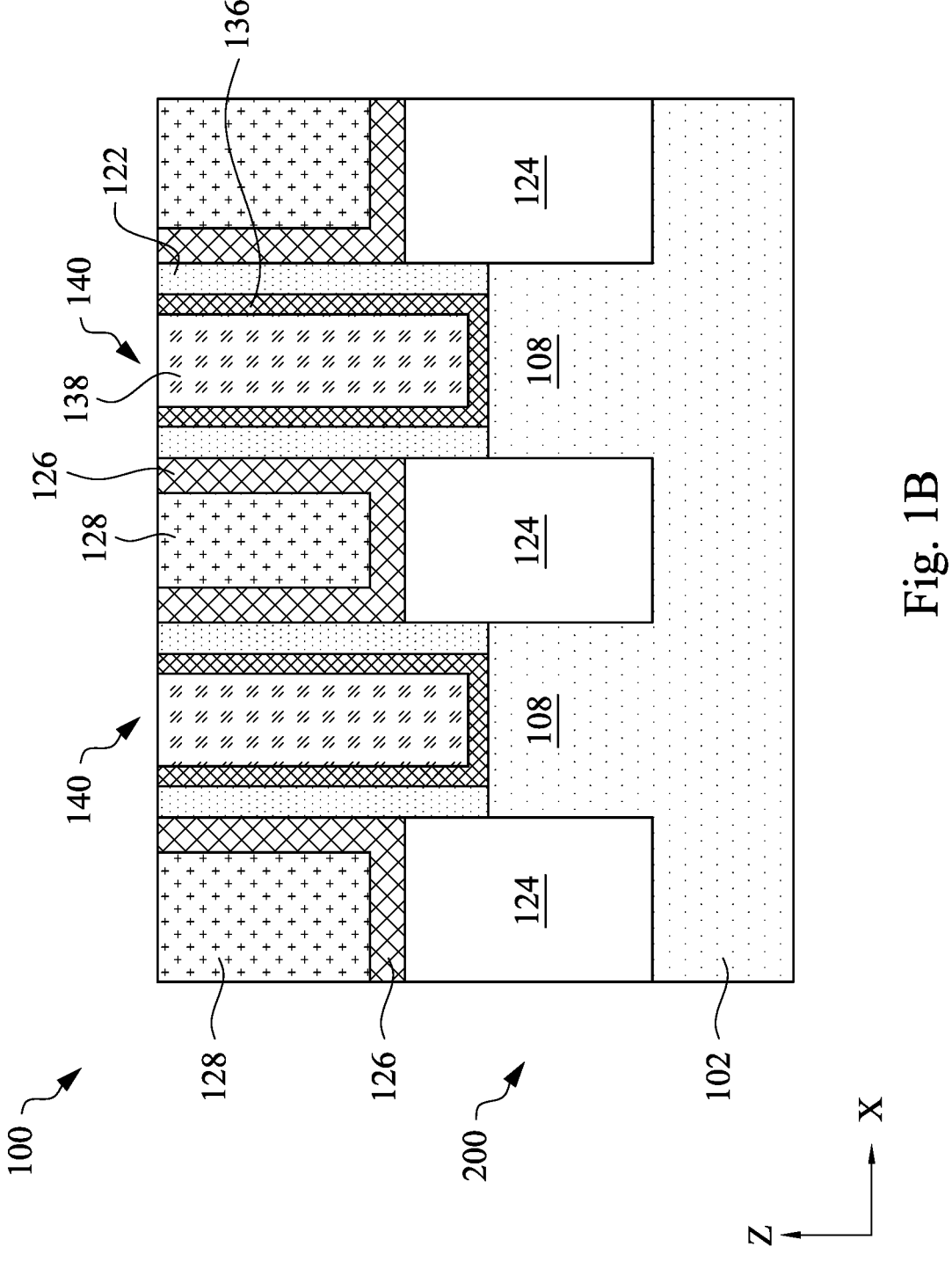
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaSb, InAlAs, InGaAs, GaSbP, GaAsSb, GaN, GaP, and InP.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). In this disclosure, a source region and a drain region are interchangeably used, and the structures thereof are substantially the same. Furthermore, source/drain region(s) may refer to a source or a drain, individually or collectively dependent upon the context. The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
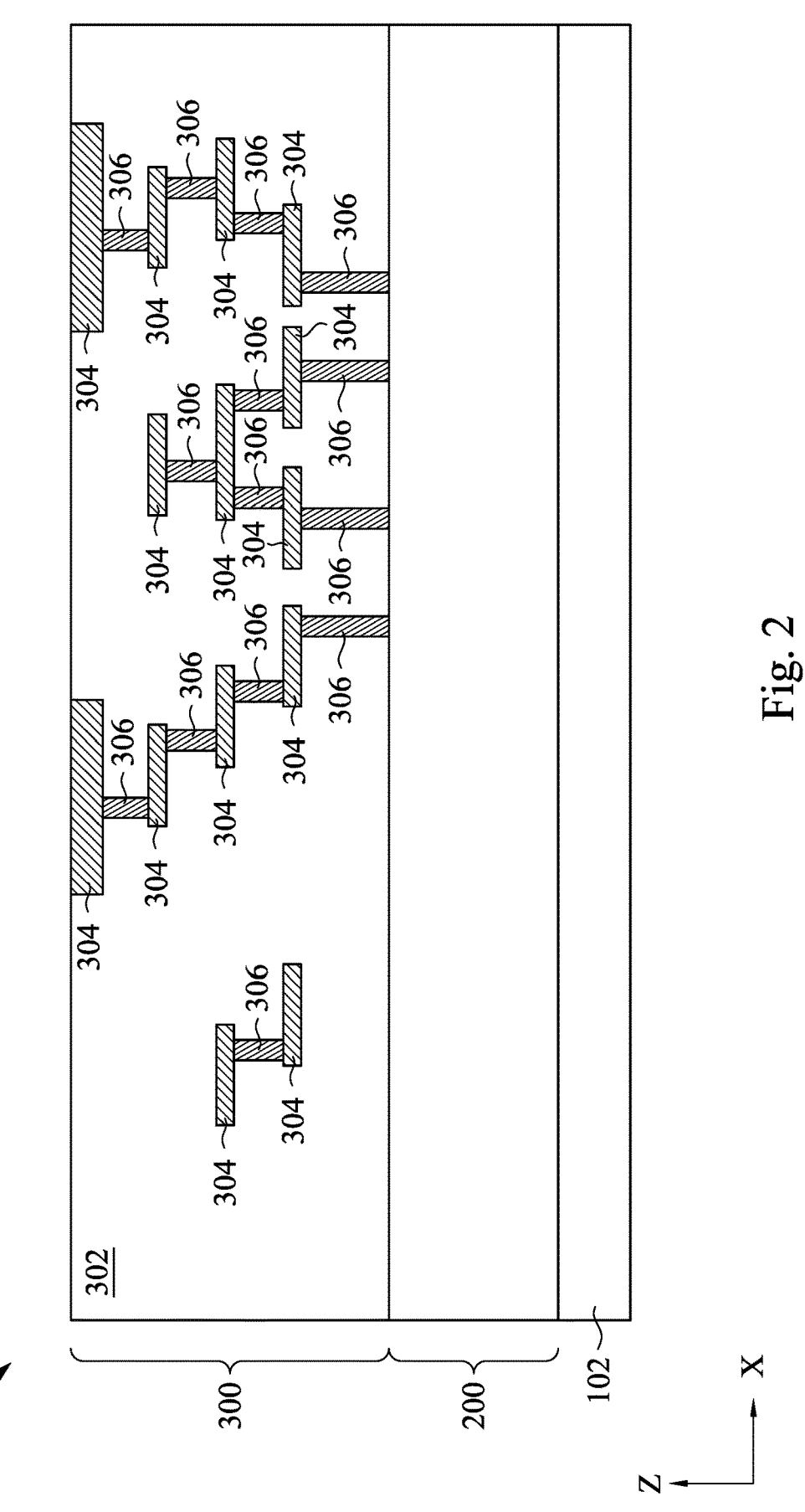
FIG. 2 is a cross-sectional side view of a stage of manufacturing the semiconductor device structure, in accordance with some embodiments.

The semiconductor device structure 100 may further includes an interconnect structure 300 disposed over the devices 200 and the substrate 102, as shown in FIG. 2. The interconnect structure 300 includes various conductive features, such as a first plurality of conductive features 304 and second plurality of conductive features 306, and intermetal dielectric (IMD) layers 302 to separate and isolate various conductive features 304, 306. The interconnect structure 300 may further include etch stop layers (not shown), which may be omitted for clarity. In some embodiments, the first plurality of conductive features 304 are conductive lines and the second plurality of conductive features 306 are conductive vias. The interconnect structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnect structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made of copper, aluminum, rhodium, ruthenium, iridium, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, the conductive features 304, 306 may include a two-dimensional material. The interconnect structure 300 may also include barrier layers (not shown) in contact with corresponding conductive features 304, 306, and the barrier layers are omitted for clarity.

The IMD layers 302 include one or more dielectric materials to provide isolation functions to various conductive features 304, 306. The IMD layers 302 may embed multiple levels of conductive features 304, 306. Each 1 MB layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

Figures 3A, 3B:
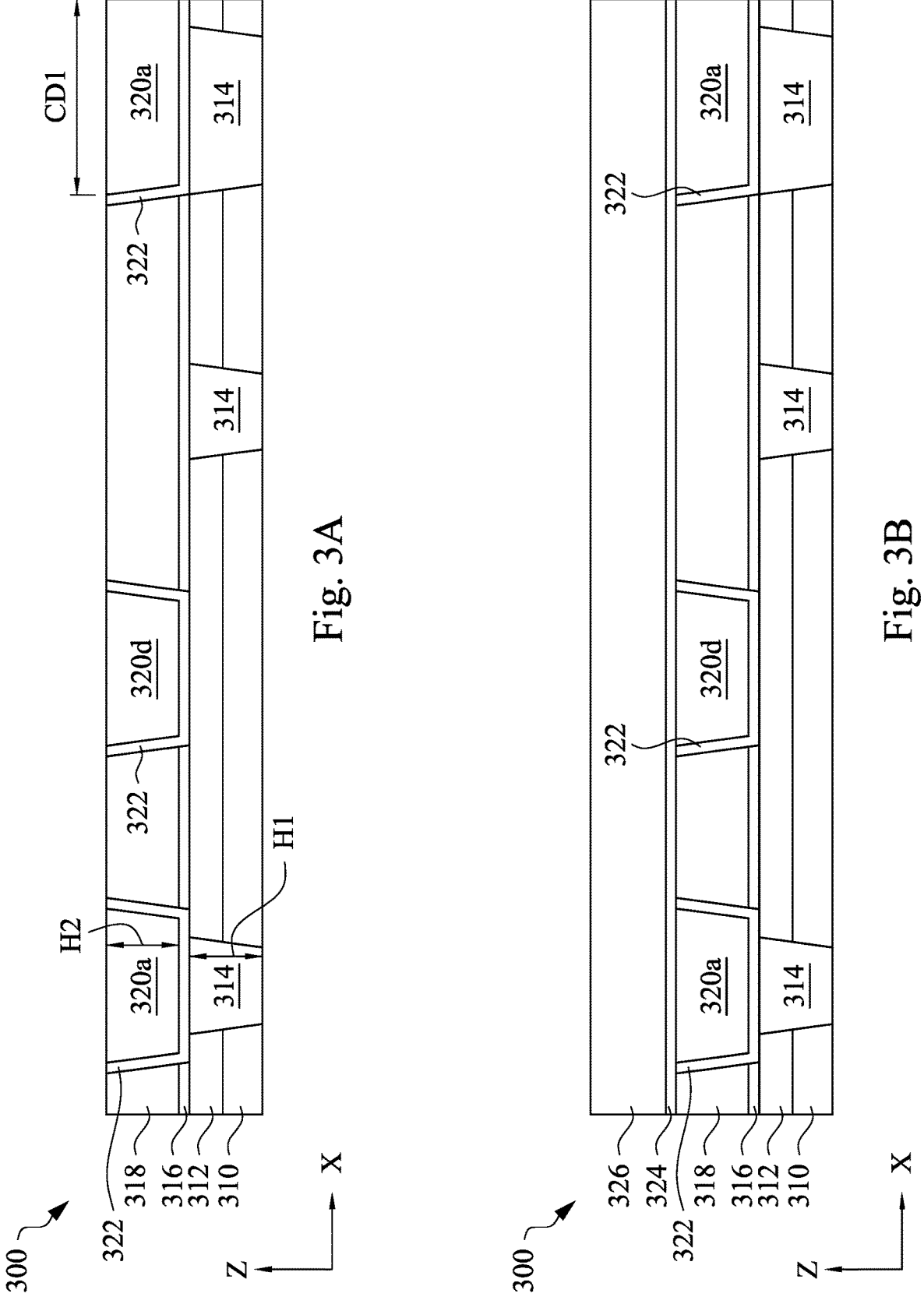
FIGS. 3A-3D are cross-sectional side views of various stages of manufacturing an interconnect structure, in accordance with some embodiments.

FIGS. 3A-3D are cross-sectional side views of various stages of manufacturing the interconnect structure 300, in accordance with some embodiments. As shown in FIG. 3A, the interconnect structure 300 includes an etch stop layer 310 and a dielectric layer 312 disposed on the etch stop layer 310. The etch stop layer 310 may include any suitable material. In some embodiments, the etch stop layer 310 includes SiCN, $SiO_2$, $SiN_x$, $AlO_xN_y$, Ru, W, Ti, Al, Co, a metal oxide (e.g., $AlO_x$), or other suitable material. The etch stop layer 310 may be a single layer structure or a multi-layer structure. The dielectric layer 312 may be an IMD layer. For example, the dielectric layer 312 may be one of the 1 MB layers 302 (FIG. 2). The dielectric layer 312 may include the same material as the ILD layer 128 or the 1 MB layer 302. In some embodiments, the dielectric layer 312 includes silicon oxide, nitride, or carbide, such as $SiO_2$, SiON, SiN, SiOCN, SiOC, metal oxide, nitride, or carbide, such as $AlO_x$, $AlO_xN_y$, $AlO_xC_y$, oxygen-doped silicon carbide (ODC), nitrogen-doped silicon carbide (NDC), an oxide formed by tetraethyl orthosilicate, (TEOS), plasma-enhanced oxide (PEOX), or other suitable dielectric material. The dielectric layer 312 may be formed by CVD, FCVD, ALD, spin coating, or other suitable process.

A plurality of conductive features 314 are formed in the etch stop layer 310 and the dielectric layer 312. The conductive features 314 each includes an electrically conductive material, such as Cu, Ti, Co, Ru, Mo, C, W, Rh, Ir, Al, $Ni_xAl_y$, $Cu_xAl_y$, $Sc_xAl_y$, $Ru_xAl_y$, or other suitable material. The conductive features 314 are formed by any suitable process, such as ECP, electroless deposition (ELD), PVD, or CVD. In some embodiments, the conductive features 314 may be the conductive features 306 shown in FIG. 2. For example, the conductive features 314 may be conductive vias. In some embodiments, a barrier layer (not shown) may be formed between the dielectric layer 312 and the conductive features 314, and a liner (not shown) may be formed between the barrier layer and the conductive features 314. The barrier layer and the liner may be formed by any suitable process, such as CVD, PECVD, or ALD.

An etch stop layer 316 is formed on the dielectric layer 312 and the conductive features 314. The etch stop layer 316 may include the same material as the etch stop layer 310. A dielectric layer 318 is formed on the etch stop layer 316. The dielectric layer 318 may include the same material as the dielectric layer 312 and may be formed by the same process as the dielectric layer 312. Conductive features 320a, 320d are formed in the dielectric layer 318 and the etch stop layer 316, as shown in FIG. 3A. Each conductive features 320a, 320d includes an electrically conductive material, such as Cu, Ti, Co, Ru, Mo, C, W, Rh, Ir, Al, $Ni_xAl_y$, $Cu_xAl_y$, $Sc_xAl_y$, $Ru_xAl_y$, or other suitable material. In some embodiments, the conductive features 320a, 320d include the same material as the conductive features 314 and are formed by the same process as the conductive features 314. In some embodiments, the conductive features 320a, 320d include different materials from the conductive features 314. The conductive features 320a may be conductive lines, such as the conductive features 304, and are electrically connected to corresponding conductive features 314. The conductive feature 320d is a dummy conductive feature, which may be formed for the purpose of balancing the conductive features and the dielectric material in order to reduce dishing effect. The conductive feature 320d may not be in contact with any active conductive features. In some embodiments, the conductive feature 320d is not present. Barrier layers 322 may be formed between corresponding conductive features 320a, 320d and the dielectric layer 318. In some embodiments, the barrier layer 322 includes Ta, TaN, Ti, TiN, Co, Ru, Nb, W, Al, Mo, Ir, or other suitable material. In some embodiments, a liner (not shown) is formed between the barrier layer 322 and the corresponding conductive features 320a, 320d. The liner may include any suitable material, such as Ta, Ti, TaN, TiN, Co, Ru, Nb, W, Al, Mo, Ir. The liner and the barrier layer 322 may include different materials. The liner and the barrier layer 322 may be both optional. The barrier layer 322 and the liner may each have a thickness ranging from about 1 nm to about 10 nm.

As shown in FIG. 3A, the conductive feature 314 may have a height H1 ranging from about 10 nm to about 500 nm, and the conductive feature 320a may have a height H2 ranging from about 10 nm to about 100 nm. The conductive feature 320a may have a top critical dimension CD1 ranging from about 10 nm to about 1000 nm.

As shown in FIG. 3B, an etch stop layer 324 is formed on the dielectric layer 318 and the conductive features 320a, 320d, and a dielectric layer 326 is formed on the etch stop layer 324. The etch stop layer 324 may include the same material as the etch stop layer 310 and may be formed by the same process as the etch stop layer 310. The dielectric layer 326 may include the same material as the dielectric layer 312 and may be formed by the same process as the dielectric layer 312.

Figure 3C:
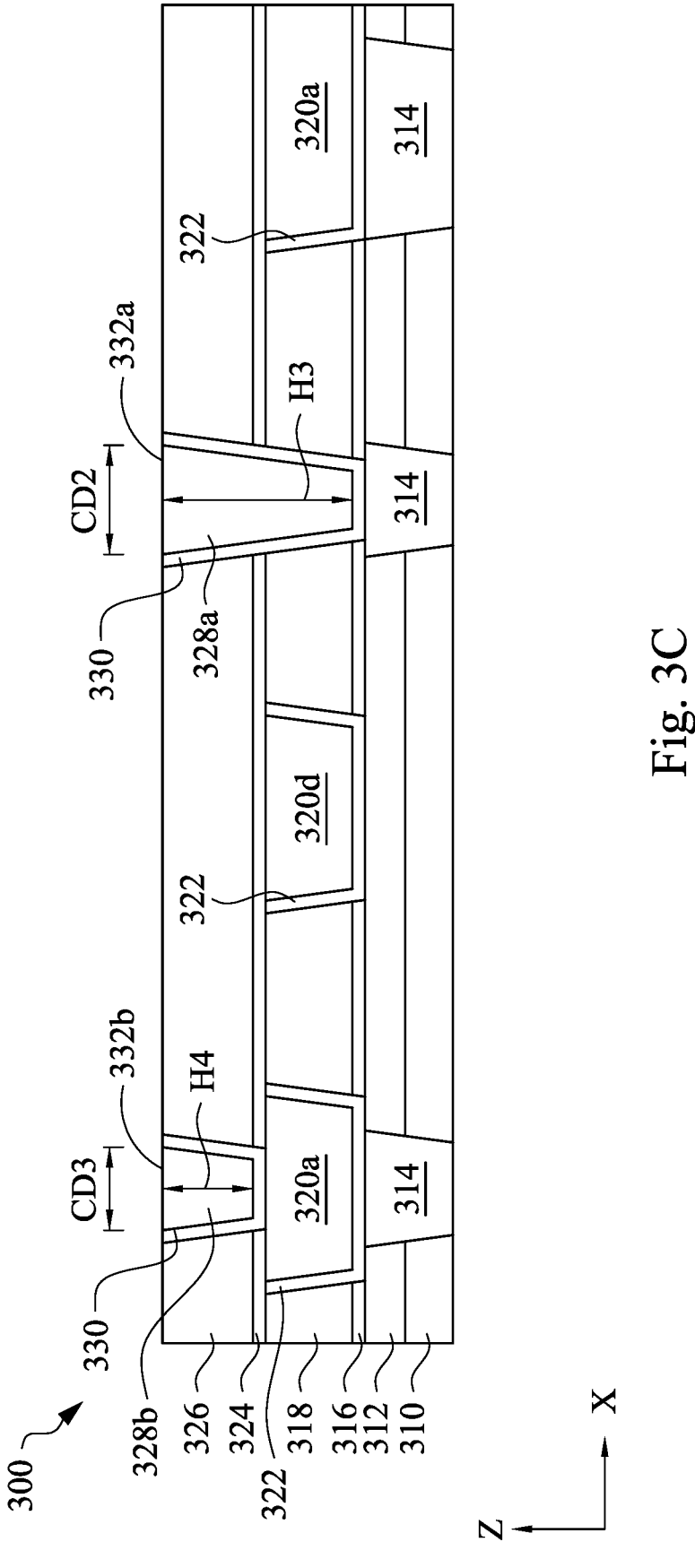

As shown in FIG. 3C, conductive features 328a, 328b are formed in the dielectric layer 326 and the etch stop layer 324. The conductive feature 328a may be electrically connected to one of the conductive features 314, and the conductive feature 328b is electrically connected to one of the conductive features 320a. The conductive feature 328a has a height H3 ranging from about 10 nm to about 300 nm, and the conductive feature 328b has a height H4 ranging from about 10 nm to about 100 nm. In some embodiments, the height H3 is about 1.5 times to about 3 times the height H4. Instead of having the conductive feature 320a disposed between the conductive feature 314 and the conductive feature 328b, the conductive feature 328a extends through the dielectric layer 318 and over the conductive feature 314. If a conductive feature, such as the conductive feature 320a, is disposed between the conductive feature 314 and the conductive feature 328a, which would have the same dimensions as the conductive feature 328b, capacitance may be increased as a result of close distance between the conductive feature and the adjacent conductive feature 320a. By having the conductive feature 328a extending through two dielectric layers 318, 326 without a conductive feature, such as a conductive line, located between the conductive feature 328a and the conductive feature 314, capacitance is substantially reduced. Furthermore, the monolithic material of the conductive feature 328a may lead to reduced electrical resistance.

As shown in FIG. 3C, barrier layers 330 are formed between corresponding conductive features 328a, 328b and the dielectric layer 326. In some embodiments, one of the barrier layers 330 is in contact with the conductive feature 328b and the conductive feature 320a, and another barrier layer 330 is in contact with the conductive feature 328a and the conductive feature 314. In some embodiments, a liner (not shown) is disposed between the barrier layer 330 and the corresponding conductive feature 328a, 328b. A planarization process, such as a chemical-mechanical polishing (CMP) process, may be performed to remove portions of the conductive features 328a, 328b and portions of the barrier layers 330 formed on the dielectric layer 326. As a result, a top surface 332a of the conductive feature 328a may be substantially coplanar with a top surface 332b of the conductive feature 328b. In some embodiments, the top surfaces 332a, 332b may be also coplanar with a top surface of the dielectric layer 326. The conductive feature 328a has a top critical dimension CD2 ranging from about 10 nm to about 100 nm, and the conductive feature 328b has a top critical dimension CD3 ranging from about 10 nm to about 100 nm. In some embodiments, each conductive feature 328a, 328b has tapered side surfaces, and the top critical dimension CD2 is substantially greater than the top critical dimension CD3, such as about 10 percent to about 50 percent greater. Because the height H3 is substantially greater than height H4 and the side surfaces of the conductive features 328a, 328b are tapered, increased top critical dimension CD2 can lead to increased bottom critical dimension of the conductive feature 328a, which leads to reduced contact resistance.

In some embodiments, the conductive features 328a, 328b are formed simultaneously. For example, openings are formed in the dielectric layers 326, 318 and the etch stop layers 324, 316 by the same lithography and etch processes, and the conductive features 328a, 328b are formed in the openings by the same deposition process. In some embodiments, the conductive features 328a, 328b are formed at different times. For example, the conductive feature 328b may be first formed in the dielectric layer 326 and the etch stop layer 324, then an opening is formed in the dielectric layers 326, 318 and the etch stop layers 324, 316, and then the conductive feature 328a is formed in the opening.

Figure 3D:
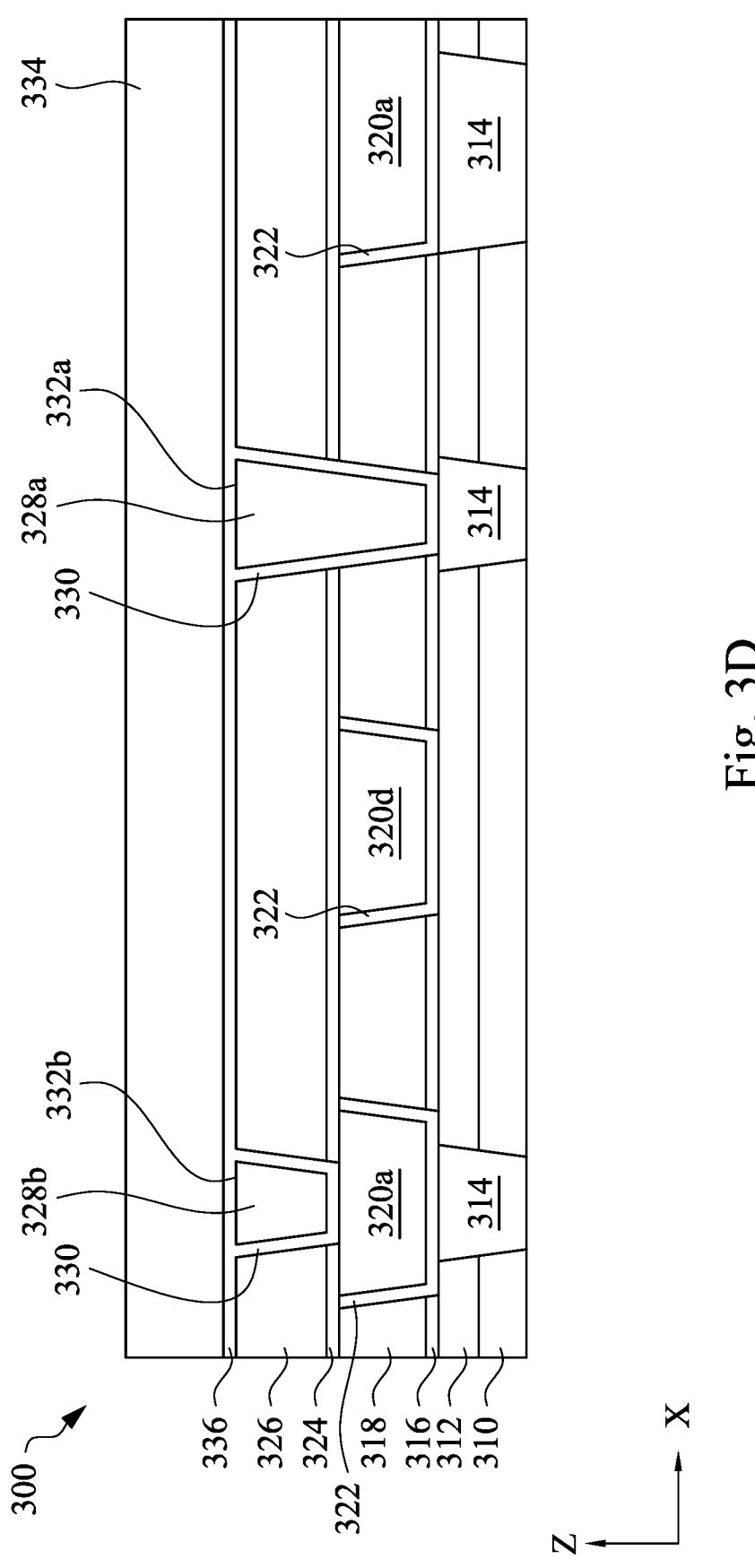

As shown in FIG. 3D, a conductive feature 334 is formed over the dielectric layer 326 and the conductive features 328a, 328b. The conductive feature 334 may include the same material as the conductive features 314 and may be formed by the same process as the conductive features 314. In some embodiments, a barrier layer 336 may be formed on the dielectric layer 326 and the conductive features 328a, 328b, and the conductive feature 334 is formed on the barrier layer 336. The barrier layer 336 may include the same material as the barrier layer 322 and may be formed by the same process as the barrier layer 322. In some embodiments, the barrier layer 336 is in contact with the top surfaces 332a, 332b. In some embodiments, a liner (not shown) is formed on the barrier layer 336, and the conductive feature 334 is formed on the liner. The liner and the barrier layer 336 may be optional, and the conductive feature 334 may be in contact with the top surfaces 332a, 332b.

Figure 4A:
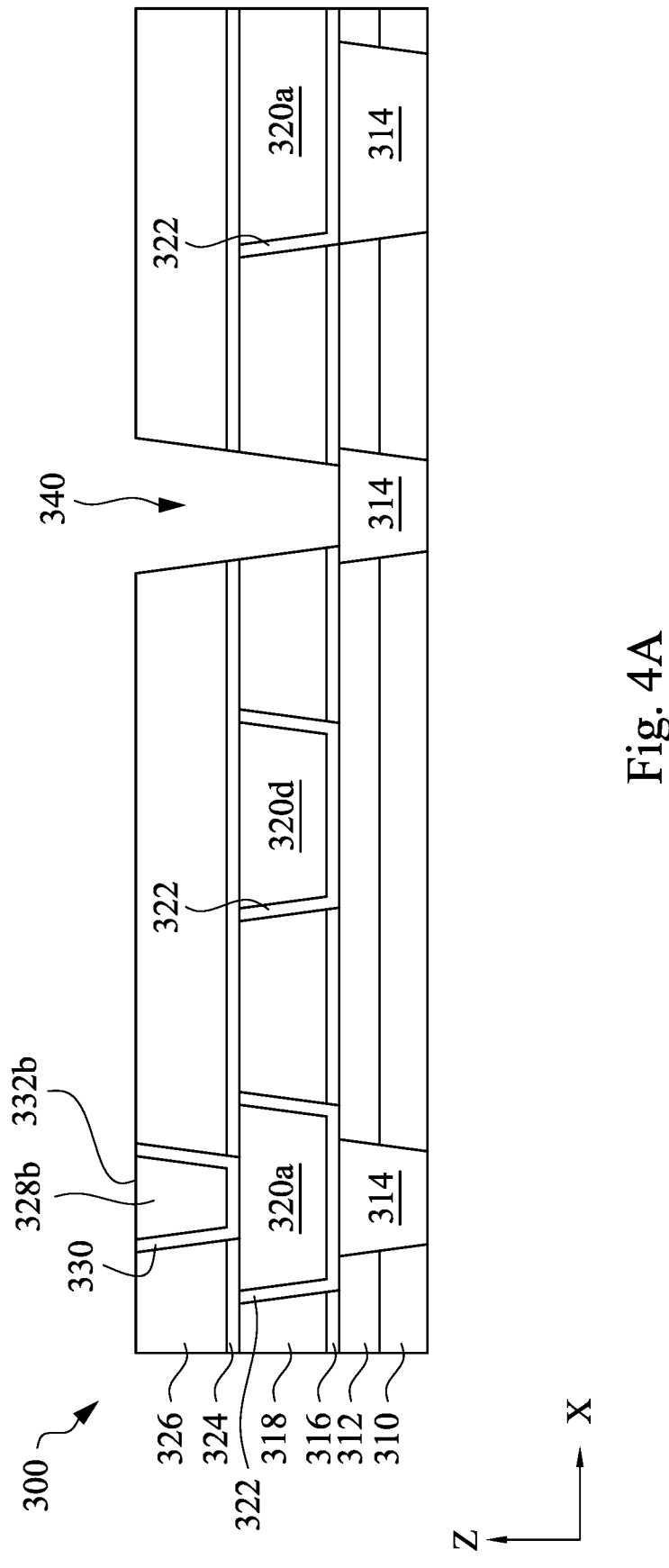
FIGS. 4A-4C are cross-sectional side views of various stages of manufacturing the interconnect structure, in accordance with alternative embodiments.
Figure 4B:
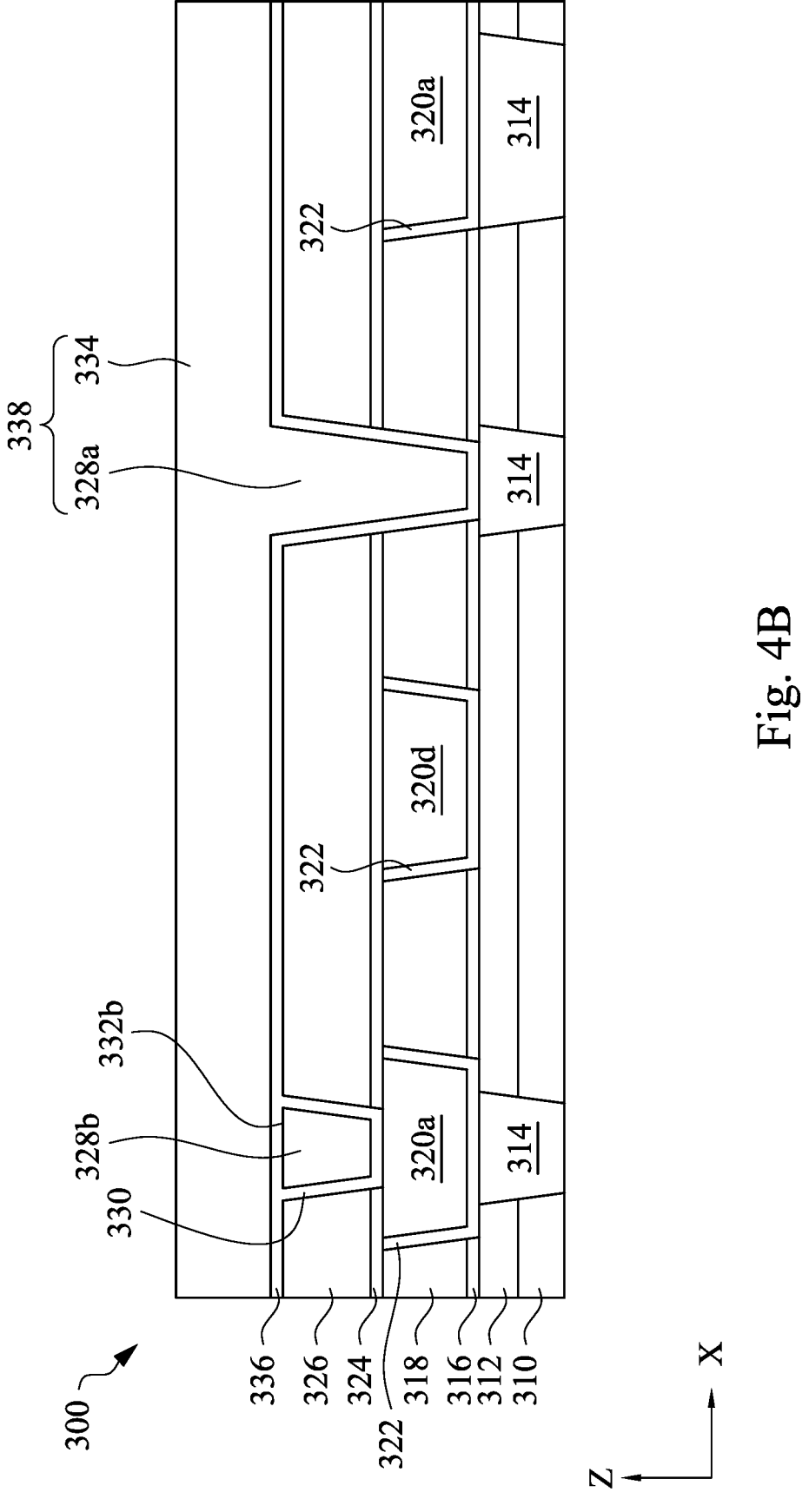
Figure 4C:
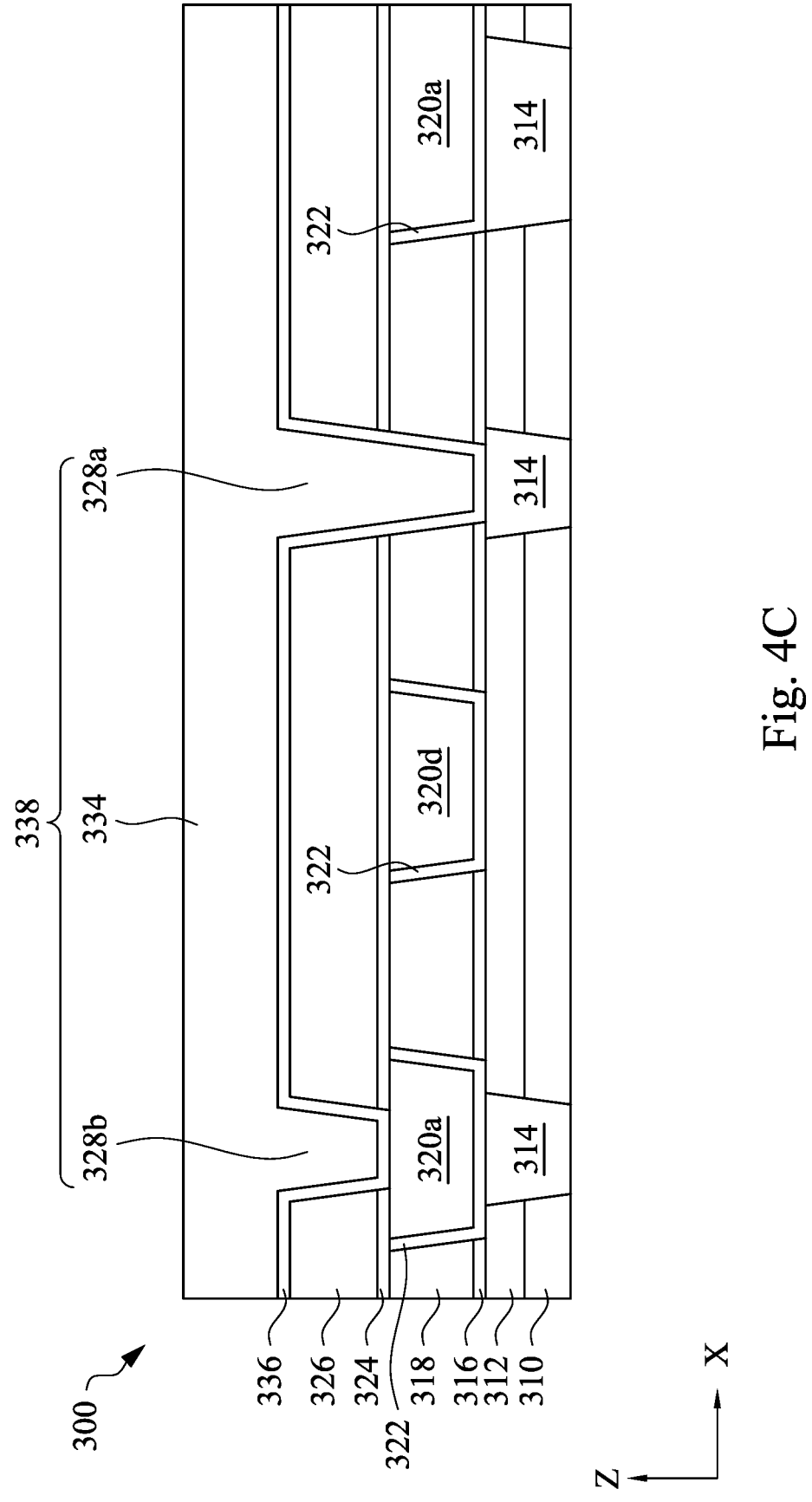

The conductive feature 328a, which may be a conductive via, extends through multiple dielectric layers, so a conductive feature, such as a conductive line, may be omitted, in order to reduce capacitance. The conductive feature 328a may be formed by any suitable process. The process described in FIGS. 3A to 3D is a single damascene process. FIGS. 4A to 4C illustrate dual damascene processes for forming the conductive feature 328a.

FIGS. 4A-4C are various views of one of various stages of manufacturing the interconnect structure 300, in accordance with alternative embodiments. As shown in FIG. 4A, the conductive feature 328b and the barrier layer 330 are formed in the dielectric layer 326 and the etch stop layer 324. Then, an opening 340 is formed in the dielectric layers 326, 318 and the etch stop layers 324, 316 to expose at least a portion of the conductive feature 314. The opening 340 may be formed by multiple etch processes, such as a first etch process to remove a portion of the dielectric layer 326, a second etch process to remove a portion of the etch stop layer 324, a third etch process to remove a portion of the dielectric layer 318, and a fourth etch process to remove a portion of the etch stop layer 316. A patterned mask (not shown) may be formed on the dielectric layer 326 to cover a portion of the dielectric layer 326 and the conductive feature 328b. The patterned mask is removed after the opening 340 is formed.

As shown in FIG. 4B, the barrier layer 336 is formed on the dielectric layer 326 and in the opening 340, and a conductive feature 338 is formed in the opening 340 and over the dielectric layer 326. The conductive feature 338 includes a first portion, which is the conductive feature 328a, and a second portion, which is the conductive feature 334. For example, the first portion of the conductive feature 338 is a conductive via, and the second portion of the conductive feature 338 is a conductive line. The conductive feature 338 is formed by a dual damascene process. In some embodiments, the conductive feature 338 is monolithic, and the conductive features 328a, 334 include the same material and formed by the same process. In some embodiments, the conductive features 328a, 334 include different materials and are formed by different processes.

In some embodiments, the conductive feature 328b is also formed at the same time as the conductive features 328a, 334. For example, the conductive feature 328b is not formed before forming the opening 340 (FIG. 4A). Instead, at the time the opening 340 is formed, an opening is formed in the dielectric layer 326 and the etch stop layer 324 to expose at least a portion of the conductive feature 320a. In some embodiments, the opening if formed by the first and second etch processes described in FIG. 4A. The remaining third and fourth etch processes to form the opening 340 are selective and do not substantially affect the materials of the conductive feature 320a and the barrier layer 322. Next, as shown in FIG. 4C, the conductive feature 338 is formed in the openings. The conductive feature 338 also includes a third portion, which is the conductive feature 328b. The third portion of the conductive feature 338 may be a conductive via. In some embodiments, the conductive feature 338 is monolithic, and the conductive features 328a, 328b, 334 include the same material and formed by the same process. In some embodiments, the conductive features 328a, 328b, 334 include different materials and are formed by different processes.

Figures 5A, 5B:
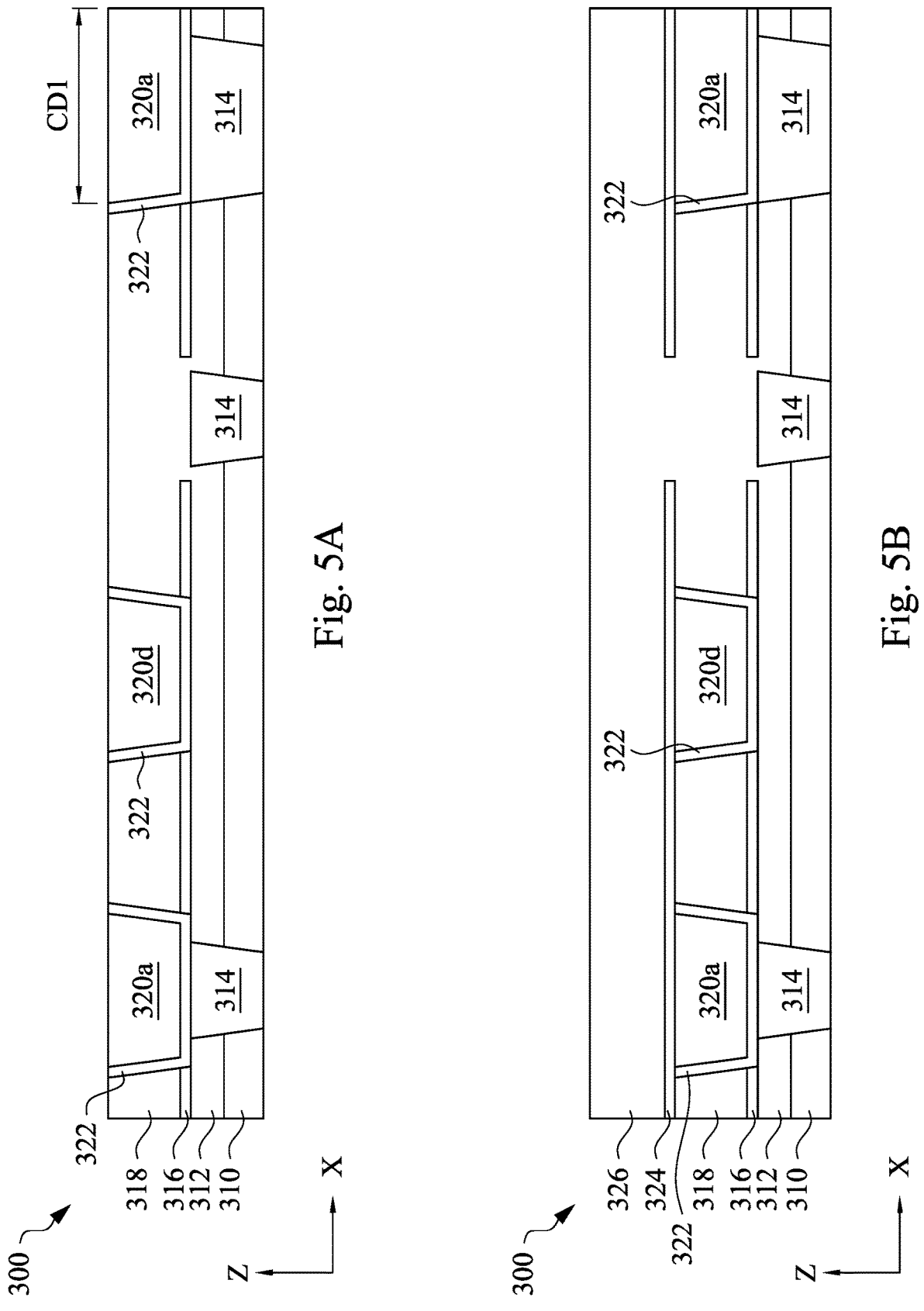
FIGS. 5A-5C are cross-sectional side views of various stages of manufacturing the interconnect structure, in accordance with alternative embodiments.
Figure 5C:
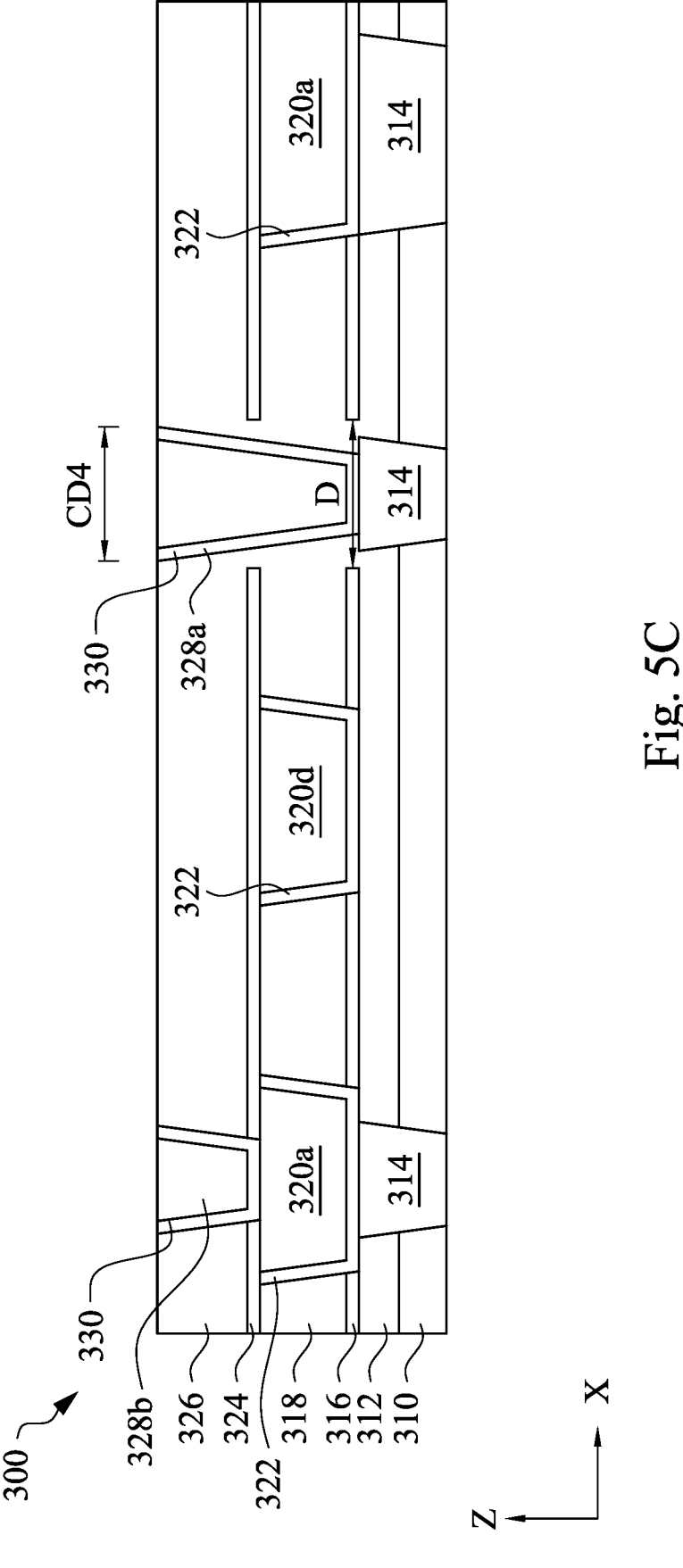

FIGS. 5A-5C are various views of one of various stages of manufacturing the interconnect structure 300, in accordance with alternative embodiments. As shown in FIG. 5A, after forming the etch stop layer 316 and before forming the dielectric layer 318, the etch stop layer 316 may be patterned. For example, a patterned mask (not shown) may be formed on the etch stop layer 316 to expose a portion of the etch stop layer 316, and the exposed portion of the etch stop layer 316 is removed to expose the conductive feature 314 and portions of the dielectric layer 312. The dielectric layer 318 is then formed on the conductive feature 314, the exposed portions of the dielectric layer 312, and the etch stop layer 316.

As shown in FIG. 5B, after forming the etch stop layer 324 and before forming the dielectric layer 326, the etch stop layer 324 may be patterned. For example, a patterned mask (not shown) may be formed on the etch stop layer 324 to expose a portion of the etch stop layer 324, and the exposed portion of the etch stop layer 324 is removed to expose a portion of the dielectric layer 318. The dielectric layer 326 is then formed on the exposed portion of the dielectric layer 318 and the etch stop layer 324.

As shown in FIG. 5C, the conductive features 328a, 328b are formed. The conductive features 328a, 328b (and the corresponding barrier layers 330 if utilized) may be formed at different times. For example, a first patterned mask is formed on the dielectric layer 326 to expose a portion of the dielectric layer 326 disposed over the conductive feature 320a. Then, a first etch process is performed to remove the exposed portion of the dielectric layer 326 to expose a portion of the etch stop layer 324, and a second etch process is performed to remove the exposed portion of the etch stop layer 324 to expose a portion of the conductive feature 320a. An opening is formed in the dielectric layer 326 and the etch stop layer 324 by the first and second etch processes. The conductive feature 328b (and the barrier layer 330 if utilized) is then formed in the opening. A planarization process may be performed to expose the dielectric layer 326. A second patterned mask is formed on the dielectric layer 326 to expose a portion of the dielectric layer 326 disposed over the conductive feature 314. Then, a single etch process is performed to form an opening in the dielectric layers 326, 318 to expose the conductive feature 314. In some embodiments, the dielectric layers 326, 318 include the same material. Next, the conductive feature 328a (and the barrier layer 330 if utilized) is formed in the opening.

As shown in FIG. 5C, the conductive feature 328a and the barrier layer 330 together has a top critical dimension CD4 and are disposed between edges of the etch stop layer 316. In some embodiments, the distance D between the edges of the etch stop layer 316 may be substantially greater than the top critical dimension CD4. The greater distance D provides larger processing window for forming the opening for the conductive feature 328a to be formed therein. As shown in FIG. 5C, the etch stop layer 316 is space apart from the conductive feature 328a (or the barrier layer 330), and the etch stop layer 324 is space apart from the conductive feature 328a (or the barrier layer 330).

The conductive feature 334 (FIG. 3D) is then formed over the conductive features 328a, 328b. The processes described in FIGS. 5A to 5C may be also used in the dual damascene process described in FIGS. 4A to 4C.

Figures 6A, 6B:
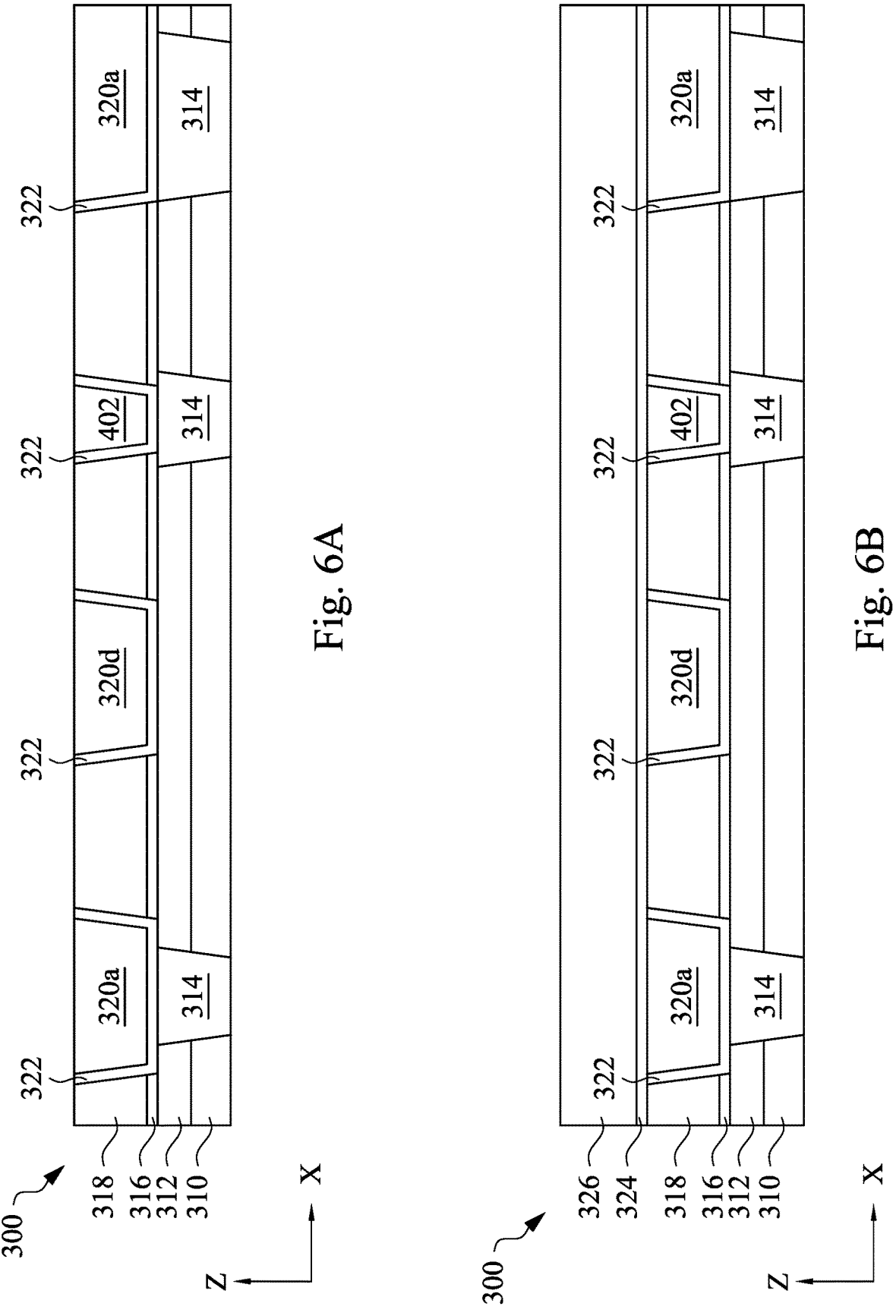
FIGS. 6A-6C are cross-sectional side views of various stages of manufacturing the interconnect structure, in accordance with alternative embodiments.
Figure 6C:
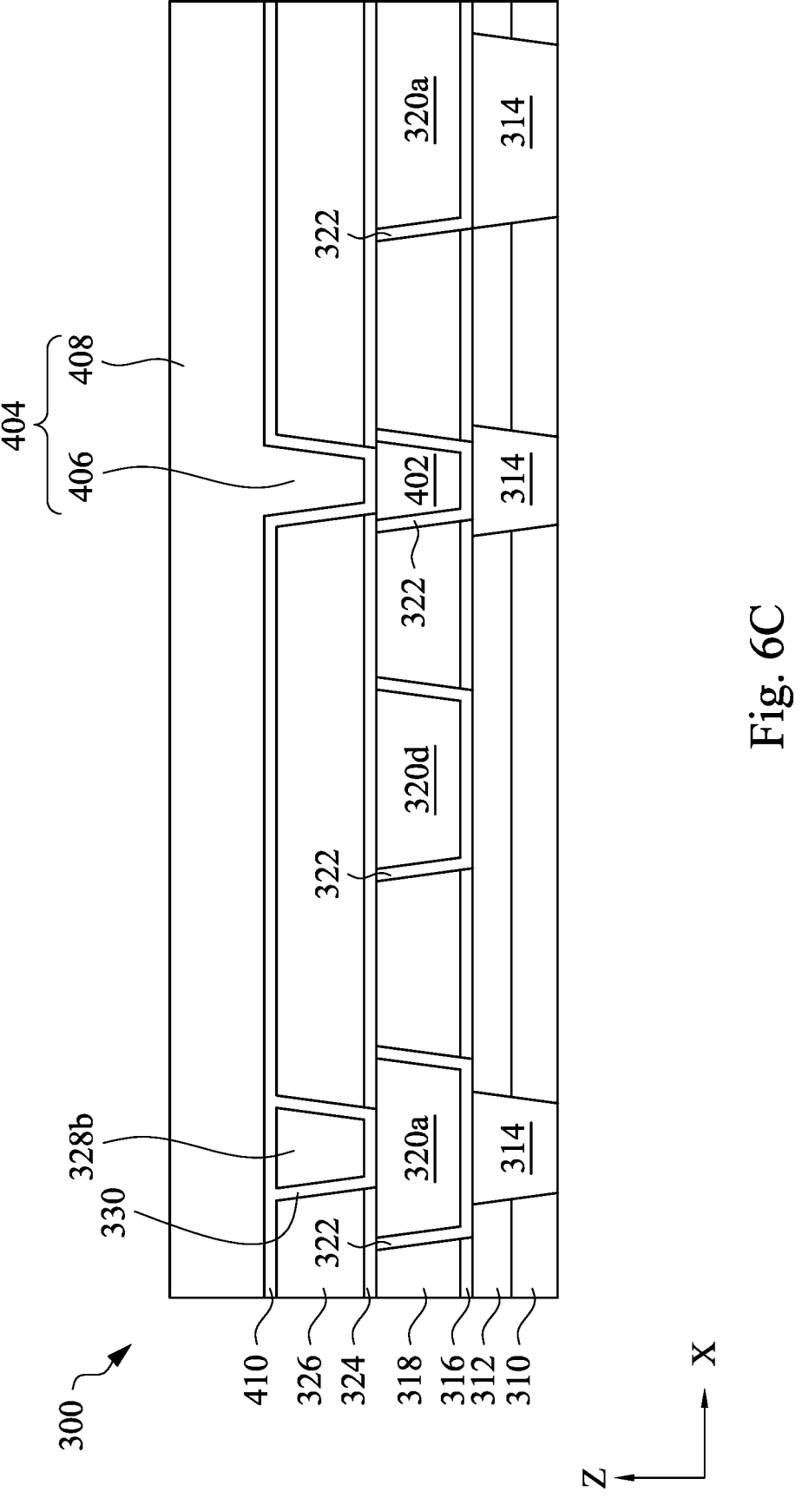

FIGS. 6A-6C are various views of one of various stages of manufacturing the interconnect structure 300, in accordance with alternative embodiments. As shown in FIG. 6A, in addition to the conductive features 320a, 320b, a conductive feature 402 is formed in the dielectric layer 318 and the etch stop layer 316. The conductive feature 402 is electrically connected to the conductive feature 314. The conductive feature 402 may include the same material as the conductive feature 314. The barrier layer 322 may be formed between the conductive feature 402 and the dielectric layer 318. In some embodiments, the conductive feature 402 is a conductive via, and the conductive features 320a, 320b are conductive lines each having substantially larger dimensions than the conductive via. By using a conductive via in the dielectric layer 318, capacitance is substantially reduced as a result of the reduced dimensions of the conductive via.

As shown in FIG. 6B, the etch stop layer 324 and the dielectric layer 326 are formed on the conductive features 320a, 320b, 402 and the dielectric layer 318. Next, as shown in FIG. 6C, a conductive feature 404 is formed in the dielectric layer 326 and the etch stop layer 324. The conductive feature 404 may include a first portion 406 and a second portion 408 located on the first portion 406. In some embodiments, the first portion 406 is a conductive via, and the second portion 408 is a conductive line. The conductive feature 404 may include the same material as the conductive feature 314. In some embodiments, the first portion 406 of the conductive feature 404 includes the same material as the conductive feature 402. In some embodiments, the first portion 406 of the conductive feature 404 includes a material different from the conductive feature 402. In some embodiments, the conductive feature 404 having the first portion 406 and the second portion 408 is formed by a dual damascene process, as shown in FIG. 6C. In some embodiments, the first and second portions 406, 408 may be formed by single damascene process.

As shown in FIG. 6C, a barrier layer 410 may be formed between the conductive feature 404 and the dielectric layer 326. The barrier layer 410 may include the same material as the barrier layer 322. In some embodiments, a liner (not shown) may be formed between the barrier layer 322 and the conductive feature 404. In some embodiments, the conductive feature 328b is formed at a different time by a different process from the conductive feature 404. In some embodiments, the conductive feature 328b is formed at the same time by the same process as the conductive feature 404, and the conductive feature 328b is a portion of the conductive feature 404.

Figure 7B:
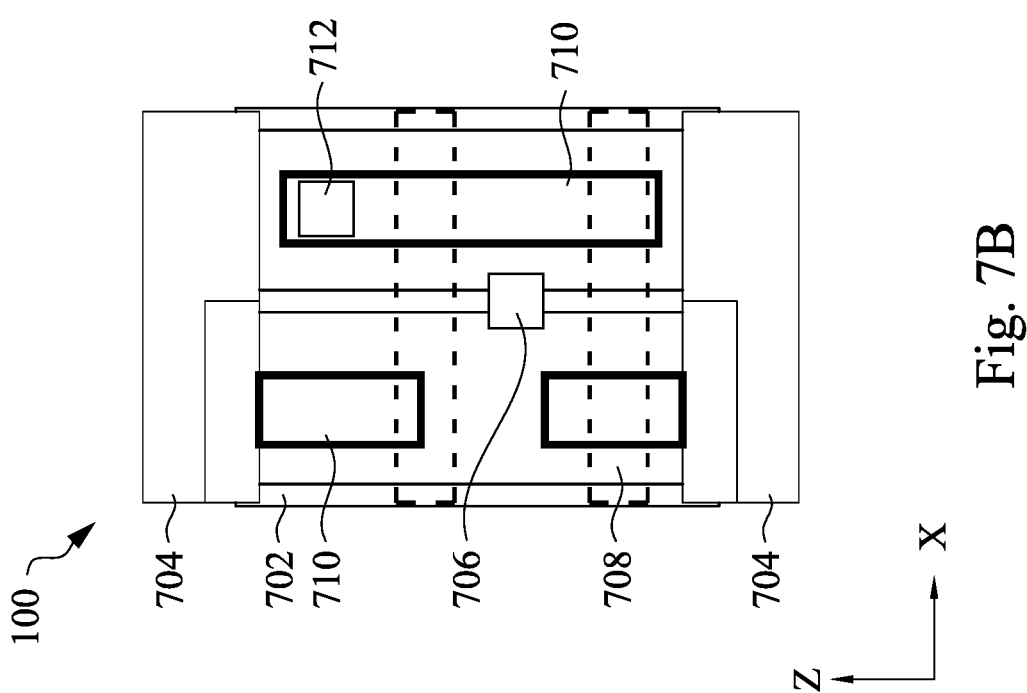
FIGS. 7A-7D are schematic top views of the semiconductor device structure, in accordance with some embodiments.
Figure 7A:
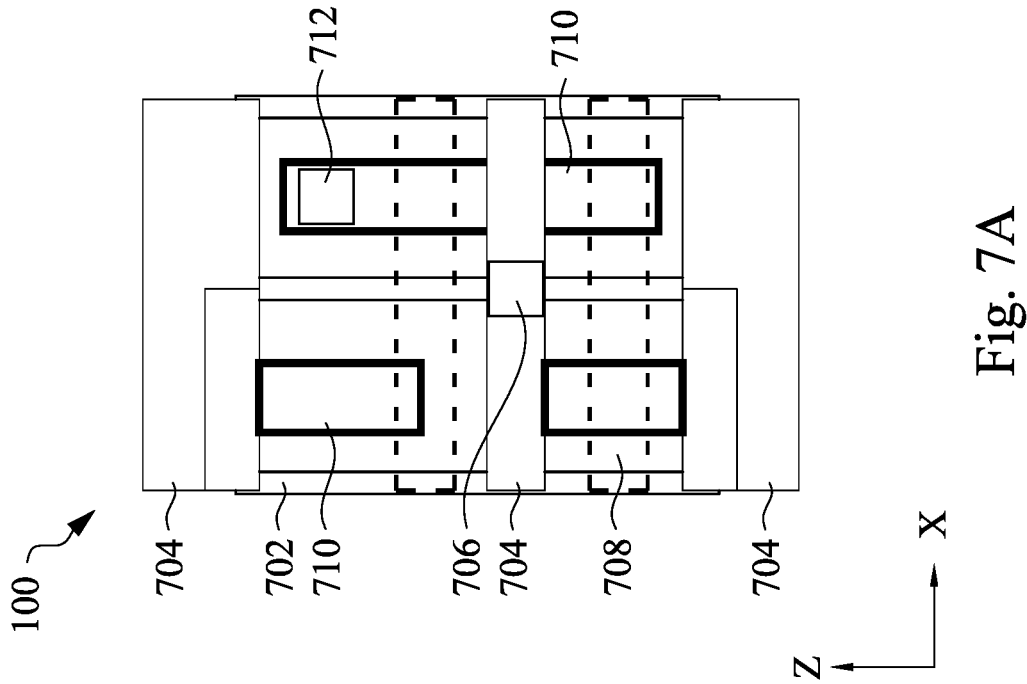

FIGS. 7A-7D are schematic top views of the semiconductor device structure 100, in accordance with some embodiments. As shown in FIG. 7A, the semiconductor device structure 100 includes a plurality of gate electrode layers 702, conductive features 704 electrically connected to the gate electrode layers 702, and a conductive feature 706 electrically connected to one of the conductive features 704. In some embodiments, the gate electrode layers 702 are the gate electrode layers 138 (FIG. 1A), the conductive features 704 may be the conductive features 320a (FIG. 3C), and the conductive feature 706 may be the conductive feature 328b (FIG. 3C). The semiconductor device structure 100 further includes conductive features 710, and a conductive feature 712 electrically connected to one of the conductive features 710. The conductive features 710 may be the conductive contacts disposed over the S/D regions 124 (FIG. 1B), and the conductive feature 712 may be the conductive feature 328a (FIG. 3C). The semiconductor device structure 100 may further includes conductive features 708, which may be dummy conductive features, such as the conductive feature 320d (FIG. 3A).

In some embodiments, the conductive feature 704 disposed between the conductive feature 706 and one of the gate electrode layers 702 is omitted, and the conductive feature 706 is directly disposed over the gate electrode layer 702, as shown in FIG. 7B. The conductive feature 706 shown in FIG. 7B may be the conductive feature 328a (FIG. 3C).

Figure 7D:
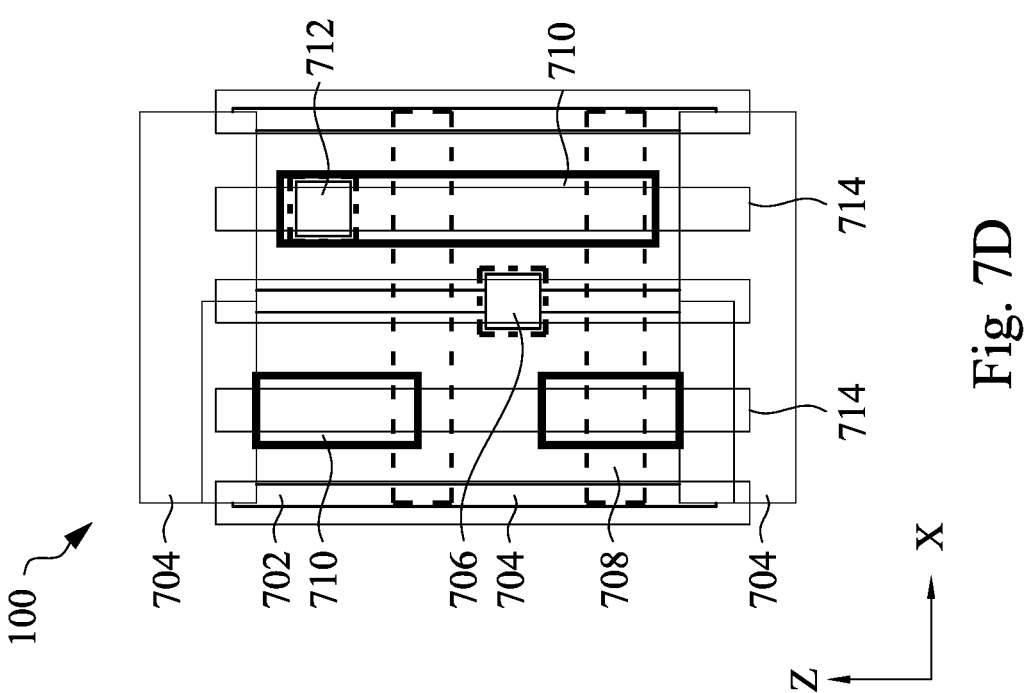
Figure 7C:
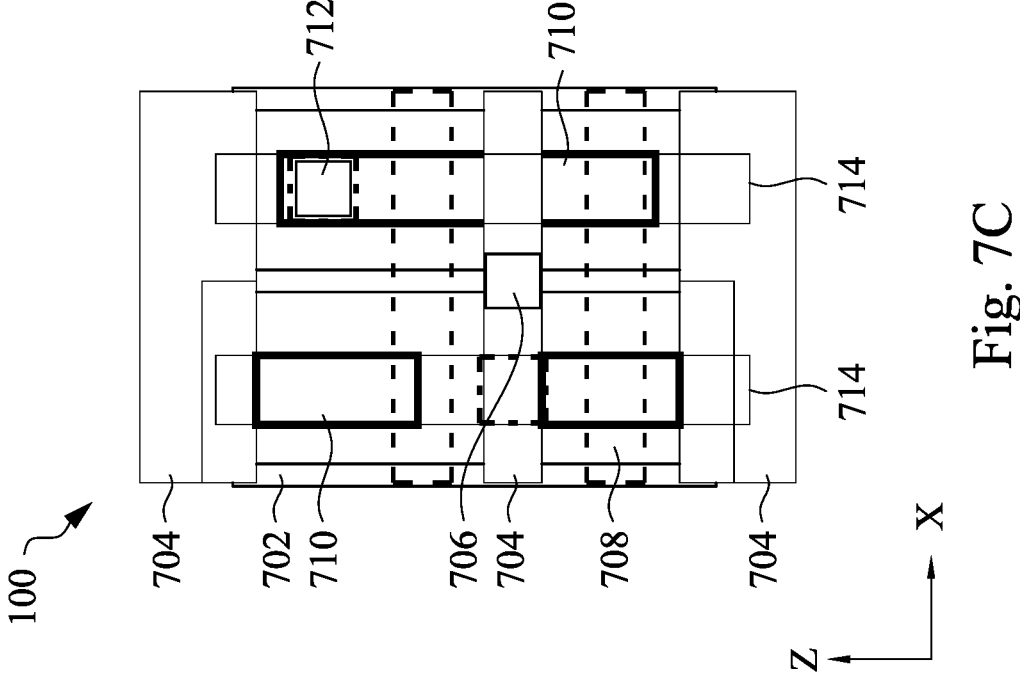

As shown in FIG. 7C, conductive features 714 are formed over the conductive features 710 of the semiconductor device structure 100 shown in FIG. 7A. In some embodiments, the conductive features 714 may be the conductive feature 334 (FIG. 3D). The semiconductor device structure 100 shown in FIG. 7C may have a gear ratio (ratio of conductive features 714 to the gate electrode layers 702) of 1 to 1. As shown in FIG. 7D, conductive features 714 are formed over the conductive features 710 of the semiconductor device structure 100 shown in FIG. 7B. The semiconductor device structure 100 shown in FIG. 7D may have a gear ratio of 2 to 1. The conductive feature 328a (FIG. 3A) may be used in any suitable configurations to reduce capacitance and to shortening conducting length.

The conductive feature 328a may be used in various circuit designs to reduce capacitance and to release routing congestion. The conductive feature 328a may be used in the interconnect structure 300 disposed over a front side of the substrate 102. In some embodiments, the conductive feature 328a may be also used in an interconnect structure disposed over a backside of the substrate 102. The conductive feature 328a may be formed by any suitable process, such as single damascene process, dual damascene process, metal etching process, or other suitable process. The conductive feature 328a may be used in different gear ratio designs for the best routing density and RC performance.

The present disclosure in various embodiments provides an interconnect structure and methods of forming the same. In some embodiments, the interconnect structure includes a conductive feature 328a extending through more than one layer of dielectric layers. Some embodiments may achieve advantages. For example, capacitance is reduced.

An embodiment is an interconnect structure. The structure includes a first dielectric layer disposed over a substrate, a second dielectric layer disposed over the first dielectric layer, and a first conductive feature disposed in the second dielectric layer. The first conductive feature has a first top critical dimension and a first height. The structure further includes a second conductive feature disposed in the first and second dielectric layers. The second conductive feature has a second top critical dimension substantially greater than the first top critical dimension and a second height substantially greater than the first height.

Another embodiment is an interconnect structure. The structure includes a first dielectric layer disposed over a substrate, a first conductive feature disposed in the first dielectric layer, a second conductive feature disposed in the first dielectric layer, a second dielectric layer disposed over the first dielectric layer, and a third conductive feature disposed in the second dielectric layer. The third conductive feature is disposed over and electrically connected to the first conductive feature. The structure further includes a third dielectric layer disposed over the second dielectric layer and a fourth conductive feature disposed in the third dielectric layer. The fourth conductive feature is disposed over and electrically connected to the third conductive feature, and the fourth conductive feature has a first top critical dimension. The structure further includes a fifth conductive feature disposed in the second and third dielectric layers. The fifth conductive feature is disposed over and electrically connected to the second conductive feature, and the fifth conductive feature has a second top critical dimension substantially greater than the first top critical dimension.

A further embodiment is a method. The method includes depositing a first dielectric layer over a substrate, forming a first conductive feature in the first dielectric layer, depositing a second dielectric layer over the first conductive feature and the first dielectric layer, and forming a second conductive feature in the second dielectric layer and over the first conductive feature. The second conductive feature has a first top critical dimension. The method further includes forming a third conductive feature in the first and second dielectric layers. The third conductive feature has a second top critical dimension substantially greater than the first top critical dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnect structure disposed over a substrate, comprising:
   a first dielectric layer disposed over the substrate;
   a first etch stop layer disposed under the first dielectric layer;
   a second dielectric layer disposed over the first dielectric layer;
   a second etch stop layer disposed between the first and second dielectric layers;
   a first conductive feature disposed in the second dielectric layer, wherein the first conductive feature has a first top critical dimension and a first height;
   a first barrier layer interfacing the first conductive feature;
   a second conductive feature disposed in the first and second dielectric layers, wherein the second conductive feature has a second top critical dimension substantially greater than the first top critical dimension and a second height substantially greater than the first height, and the second conductive feature is monolithic;
   a second barrier layer interfacing the second conductive feature;
   a third conductive feature disposed in the first dielectric layer; and
   a third barrier layer interfacing the third conductive feature, wherein the first conductive feature is electrically connected to the third conductive feature, the first etch stop layer interfaces the third barrier layer and is space apart from the second barrier layer, and the second etch stop layer interfaces the first barrier layer and is space apart from the second barrier layer.

2. The interconnect structure of claim 1, wherein the second top critical dimension is about 10 percent to about 50 percent greater than the first top critical dimension.

3. The interconnect structure of claim 1, wherein the second height is about 1.5 times to about 3 times greater than the first height.

4. An interconnect structure disposed over a substrate, comprising:

a first dielectric layer disposed over the substrate;

a first conductive feature disposed in the first dielectric layer;

a second conductive feature disposed in the first dielectric layer;

a second dielectric layer disposed over the first dielectric layer;

a first etch stop layer disposed between the first dielectric layer and the second dielectric layer;

a third conductive feature disposed in the first etch stop layer and the second dielectric layer, wherein the third conductive feature is disposed over and electrically connected to the first conductive feature;

a third dielectric layer disposed over the second dielectric layer;

a second etch stop layer disposed between the second dielectric layer and the third dielectric layer;

a fourth conductive feature disposed in the second etch stop layer and the third dielectric layer, wherein the fourth conductive feature is disposed over and electrically connected to the third conductive feature, and the fourth conductive feature has a first top critical dimension;

a fifth conductive feature disposed in the first and second etch stop layers and the second and third dielectric layers, wherein the fifth conductive feature is disposed over and electrically connected to the second conductive feature, and the fifth conductive feature has a second top critical dimension substantially greater than the first top critical dimension, and the fifth conductive feature is monolithic;

a sixth conductive feature disposed over the fourth and fifth conductive features; and a first barrier layer interfacing the fourth, fifth and the sixth conductive features.

5. The interconnect structure of claim 4, wherein the sixth conductive feature is monolithic.

6. The interconnect structure of claim 4, further comprising a second barrier layer in contact with the third and fourth conductive features.

7. The interconnect structure of claim 6, further comprising a third barrier layer in contact with the third conductive feature, wherein the first etch stop layer is in contact with the first and third barrier layers, and the second etch stop layer is in contact with the first and second barrier layers.

8. A method, comprising:

depositing a first dielectric layer over a substrate;

forming a first conductive feature in the first dielectric layer;

depositing a second dielectric layer over the first conductive feature and the first dielectric layer;

forming a second conductive feature in the second dielectric layer and over the first conductive feature, wherein the second conductive feature has a first top critical dimension;

forming a third conductive feature in the first and second dielectric layers, wherein the third conductive feature has a second top critical dimension substantially greater than the first top critical dimension, and the third conductive feature is monolithic; and forming a fourth conductive feature over the second and third conductive features, wherein the third and fourth conductive features are formed by a same process at a same time.

9. The method of claim 8, further comprising forming a first barrier layer on the second conductive feature and the second dielectric layer, wherein the third and fourth conductive features are formed on the first barrier layer.

10. The method of claim 8, further comprising forming a second barrier layer on the second and third conductive features, wherein the fourth conductive feature is formed on the second barrier layer.

11. The method of claim 4, further comprising depositing a first etch stop layer, wherein the first dielectric layer is deposited on the first etch stop layer.

12. The method of claim 11, further comprising patterning the first etch stop layer to expose a fifth conductive feature, wherein the first dielectric layer interfaces the fifth conductive feature.

13. The method of claim 12, further comprising depositing a second etch stop layer on the first dielectric layer and the first conductive feature, wherein the second dielectric layer is deposited on the second etch stop layer.

14. The method of claim 13, further comprising patterning the second etch stop layer to expose a portion of the first dielectric layer, wherein the second dielectric layer interfaces the portion of the first dielectric layer.

15. The method of claim 14, wherein the third conductive feature is spaced apart from the first and second etch stop layers.

16. The method of claim 15, further comprising forming a first opening in the first and second dielectric layers, wherein the fifth conductive feature is exposed in the first opening, and the third conductive feature is formed in the first opening.

17. The method of claim 16, wherein the first opening is formed by a single etch process.

18. The method of claim 17, wherein the first and second dielectric layers comprise a same material.

19. The method of claim 16, further comprising forming a second opening in the second dielectric layer and the second etch stop layer, wherein the first conductive feature is exposed, and the second conductive feature is formed in the second opening.

20. The method of claim 19, wherein the second opening is formed by performing a first etch process to remove a portion of the second dielectric layer and a second etch process to remove a portion of the second etch stop layer.

* * * * *